United States Patent
Chiang et al.

(10) Patent No.: US 10,281,958 B2
(45) Date of Patent: May 7, 2019

(54) PORTABLE ELECTRONIC DEVICE AND PIVOTING ASSEMBLY

(71) Applicant: PEGATRON CORPORATION, Taipei (TW)

(72) Inventors: Chia-Liang Chiang, Taipei (TW); Yu-Ju Lin, Taipei (TW); Ching-Hao Yu, Taipei (TW); Hui-Hsiu Hsu, Taipei (TW); Yuan-Cyuan Wei, Taipei (TW); Chao-Wen Lai, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/112,478

(22) Filed: Aug. 24, 2018

(65) Prior Publication Data

US 2019/0107867 A1    Apr. 11, 2019

(30) Foreign Application Priority Data

Oct. 6, 2017    (TW) .............................. 106134508 A

(51) Int. Cl.
*G06F 1/16* (2006.01)
*H03G 7/00* (2006.01)
(Continued)

(52) U.S. Cl.
CPC .......... *G06F 1/1688* (2013.01); *G06F 1/1618* (2013.01); *G06F 1/1677* (2013.01);
(Continued)

(58) Field of Classification Search
CPC .... G06F 1/1688; G06F 1/1681; G06F 1/1677; G06F 1/1618; H03G 7/002; H04R 3/04;
(Continued)

(56) References Cited

U.S. PATENT DOCUMENTS 5,917,695 A * 6/1999 Youn ..................... G06F 1/1616
345/905
6,078,497 A * 6/2000 Derocher .............. G06F 1/1616
345/905

(Continued)

FOREIGN PATENT DOCUMENTS

| CN | 100521700 | 7/2009 |
|---|---|---|
| CN | 102176765 | 9/2011 |
| TW | 201433974 | 9/2014 |

*Primary Examiner* — Hoa C Nguyen
*Assistant Examiner* — Christopher L Augustin
(74) *Attorney, Agent, or Firm* — J.C. Patents

(57) ABSTRACT

A portable electronic device includes a first body, a second body, a pivoting mechanism, a linking mechanism, and a first speaker unit. The pivoting mechanism is pivoted between the first body and the second body and includes a first rotating shaft, a second rotating shaft, and a third rotating shaft, and the third rotating shaft has a mounting portion. The linking mechanism includes a first rolling member and a second rolling member. The first rolling member is connected to the third rotating shaft of the pivoting mechanism, and the second rolling member is connected to the second rotating shaft of the pivoting mechanism. The first rolling member and the second rolling member roll relative to each other within an angle range. The first speaker unit is fixed to the mounting portion.

12 Claims, 14 Drawing Sheets

(51) Int. Cl.
*H04R 1/02* (2006.01)
*H04R 3/04* (2006.01)

(52) U.S. Cl.
CPC ............ *G06F 1/1681* (2013.01); *H03G 7/002* (2013.01); *H04R 1/025* (2013.01); *H04R 3/04* (2013.01); *H04R 2499/11* (2013.01)

(58) Field of Classification Search
CPC ...... H04R 1/02; H04R 2499/11; H04R 1/025; H04R 1/2803
See application file for complete search history.

(56) References Cited

U.S. PATENT DOCUMENTS

| | | | | |
|---|---|---|---|---|
| 6,246,570 | B1* | 6/2001 | Kim ................... | G06F 1/1616 361/679.23 |
| 6,567,677 | B1* | 5/2003 | Sokoloff ............... | G06F 1/1616 348/E7.079 |
| 9,107,301 | B2 | 8/2015 | Pan et al. | |
| 9,268,371 | B2* | 2/2016 | Chen ................... | G06F 1/1681 |
| 9,794,660 | B2* | 10/2017 | Rittenhouse ............ | H04R 1/02 |
| 2007/0279857 | A1* | 12/2007 | Sun ................... | G06F 1/162 361/679.55 |
| 2009/0001232 | A1* | 1/2009 | Seo ................... | G06F 1/1616 248/176.1 |
| 2014/0307906 | A1* | 10/2014 | So ................... | H04R 1/028 381/334 |
| 2015/0245511 | A1* | 8/2015 | Hsu ................... | E05D 3/122 74/63 |
| 2017/0351303 | A1* | 12/2017 | Kuramochi ........... | G06F 1/1618 |
| 2018/0046227 | A1* | 2/2018 | Tazbaz ................ | E05D 3/06 |
| 2018/0073613 | A1* | 3/2018 | Chen ................... | F16H 25/08 |

* cited by examiner

PORTABLE ELECTRONIC DEVICE AND PIVOTING ASSEMBLY

CROSS-REFERENCE TO RELATED APPLICATION

This application claims the priority benefit of Taiwan application serial no. 106134508, filed on Oct. 6, 2017. The entirety of the above-mentioned patent application is hereby incorporated by reference herein and made a part of this specification.

BACKGROUND

Technical Field

The application relates to an electronic device. More particularly, the application relates to a portable electronic device.

Related Art

Speakers are also known as sound amplifiers and are capable of converting audio frequency signals into audible sounds. In notebook computer applications, speakers are required most of the time for a user when playing games, listening to music, and so forth. In a convertible notebook computer, the speakers are built-in and are fixed to the second body of the notebook computer equipped with the keyboard. It thus can be seen that when the first body and the second body of the notebook computer moves relatively, the audio output directions of the speakers do not necessarily face the user. If the sound made by the speakers is blocked, the volume of the speakers will be lowered, and the hearing experience is affected as the user may not or may not clearly hear the sound effect.

SUMMARY

The application provides a portable electronic device in which an audio output direction of speaker unit fixed on a pivoting mechanism may be changed to face a user according to relative movement between a first body and a second body so that the user may hear best sound effect.

The application further provides a pivoting assembly capable of enabling the audio output direction of the speaker unit to face the user.

In an embodiment of the application, a portable electronic device includes a first body, a second body, a pivoting mechanism, a linking mechanism, and a first speaker unit. The pivoting mechanism is pivoted between the first body and the second body and includes a first rotating shaft, a second rotating shaft, and a third rotating shaft. The first rotating shaft and the second rotating shaft are parallel to each other, and the third rotating shaft is located at a side of the first rotating shaft and has a mounting portion. The linking mechanism includes a first rolling member and a second rolling member. The first rolling member is connected to the third rotating shaft of the pivoting mechanism, and the second rolling member is connected to the second rotating shaft of the pivoting mechanism. The first rolling member and the second rolling member roll relative to each other within an angle range. The first speaker unit is fixed to the mounting portion. When the first body and the second body moves relative to each other, the second rotating shaft of the pivoting mechanism drives the second rolling member to roll and drives the first rolling member to roll within the angle range to enable the third rotating shaft to rotate, as such, an included angle is provided between a plane of the first speaker unit and a geometric plane defined by the first rotating shaft and the second rotating shaft.

In an embodiment of the application, the portable electronic device further includes a torque mechanism having a plurality of torque portions. The first rotating shaft has a first end and a second end opposite to each other, and the first end is pivoted to the first body. The second rotating shaft has a third end and a fourth end opposite to each other, and the third end is adjacent to the first end and is pivoted to the second body. The third rotating shaft has a fifth end and a sixth end opposite to each other, and the sixth end has the mounting portion. The torque portions are sleeved on the second end, the fourth end, and the fifth end.

In an embodiment of the application, one of the first rolling member and the second rolling member is a gear, and the other one of the first rolling member and the second rolling member is a cam.

In an embodiment of the application, the portable electronic device further includes at least one second speaker unit built in the second body, and an audio output direction of the second speaker unit faces an upper surface of the second body.

In an embodiment of the application, the portable electronic device further includes a controller, a first sensor, a second sensor, a first audio amplifier, and a second audio amplifier. The controller is disposed in the second body. The first sensor is disposed in the first body for sensing an angle and a mode of relative movement between the first body and the second body so as to generate a first sensing signal. The second sensor is disposed in the second body for sensing the angle and the mode of the relative movement between the first body and the second body so as to generate a second sensing signal. The first audio amplifier is disposed next to the first speaker unit. The second audio amplifier is disposed next to the second speaker unit. The controller receives the first sensing signal from the first sensor and the second sensing signal from the second sensor and outputs an audio frequency signal to the first audio amplifier and the second audio amplifier according to the first sensing signal and the second sensing signal. The first audio amplifier receives the audio frequency signal and outputs a first driving signal to the first speaker unit, so as to adjust volume and an audio frequency of the first speaker unit. The second audio amplifier receives the audio frequency signal and outputs a second driving signal to the second speaker unit, so as to adjust volume and an audio frequency of the second speaker unit.

In an embodiment of the application, When the first body and the second body move relative to each other to present an unfolded state, the second rolling member and the first rolling member are not within the angle range, as such, the first rolling member is not driven to drive the third rotating shaft to rotate, and that the plane of the first speaker unit and the geometric plane are parallel to each other.

In an embodiment of the application, an angle of the unfolded state is greater than 0 degree and is less than or equal to 180 degrees.

In an embodiment of the application, when the first body and the second body move relative to each other to present an unfolded state, the second rolling member drives the first rolling member, as such, the first speaker unit is linked up, and that the included angle is provided between the plane of the first speaker unit and the geometric plane.

In an embodiment of the application, an angle of the unfolded state is greater than 180 degrees and is less than 360 degrees, and the included angle is between 8 degrees and 10 degrees.

In an embodiment of the application, when the first body and the second body move relative to each other to present an overlapping state, the second rolling member drives the first rolling member, as such, the first speaker unit is, linked up, and that an included angle is provided between the plane of the first speaker unit and the geometric plane.

In an embodiment of the application, the linking mechanism further includes a third rolling member and a fourth rolling member. The third rolling member is connected to the first rolling member, and the fourth rolling member is connected to the third rotating shaft and rolls relative to the third rolling member.

In an embodiment of the application, a pivoting assembly includes a pivoting mechanism, a linking mechanism, and a speaker unit. The pivoting mechanism includes a first rotating shaft, a second rotating shaft, and a third rotating shaft. The first rotating shaft and the second rotating shaft are parallel to each other, and the third rotating shaft is located at a side of the first rotating shaft and has a mounting portion. The linking mechanism includes a first rolling member and a second rolling member. The first rolling member is connected to the third rotating shaft of the pivoting mechanism, and the second rolling member is connected to the second rotating shaft of the pivoting mechanism. The first rolling member and the second rolling member roll relative to each other within an angle range. The speaker unit is fixed to the mounting portion. When the second rotating shaft of the pivoting mechanism drives the second rolling member to roll and drives the first rolling member to roll within the angle range to enable the third rotating shaft to rotate, an included angle is provided between a plane of the speaker unit and a geometric plane defined by the first rotating shaft and the second rotating shaft.

To sum up, in the portable electronic device provided by the embodiments of the application, the first speaker unit is designed to be fixed to the mounting portion of the third rotating shaft of the pivoting mechanism. Hence, when the first body and the second body moves relatively, the second rotating shaft of the pivoting mechanism drives the second rolling member to roll, so as to drive or not to drive the first rolling member to roll. In this way, the audio output plane of the first speaker unit on the third rotating shaft is parallel to the geometric plane defined by the first rotating shaft and the second rotating shaft, or an included angle is provided between the audio output plane and the geometric plane. As such, the audio output direction of the first speaker unit faces the user. Therefore, when using the portable electronic device provided by the embodiments of the application, the user may hear the best audio effect and enjoy favorable listening experience.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF THE EMBODIMENTS

Figure 1A:
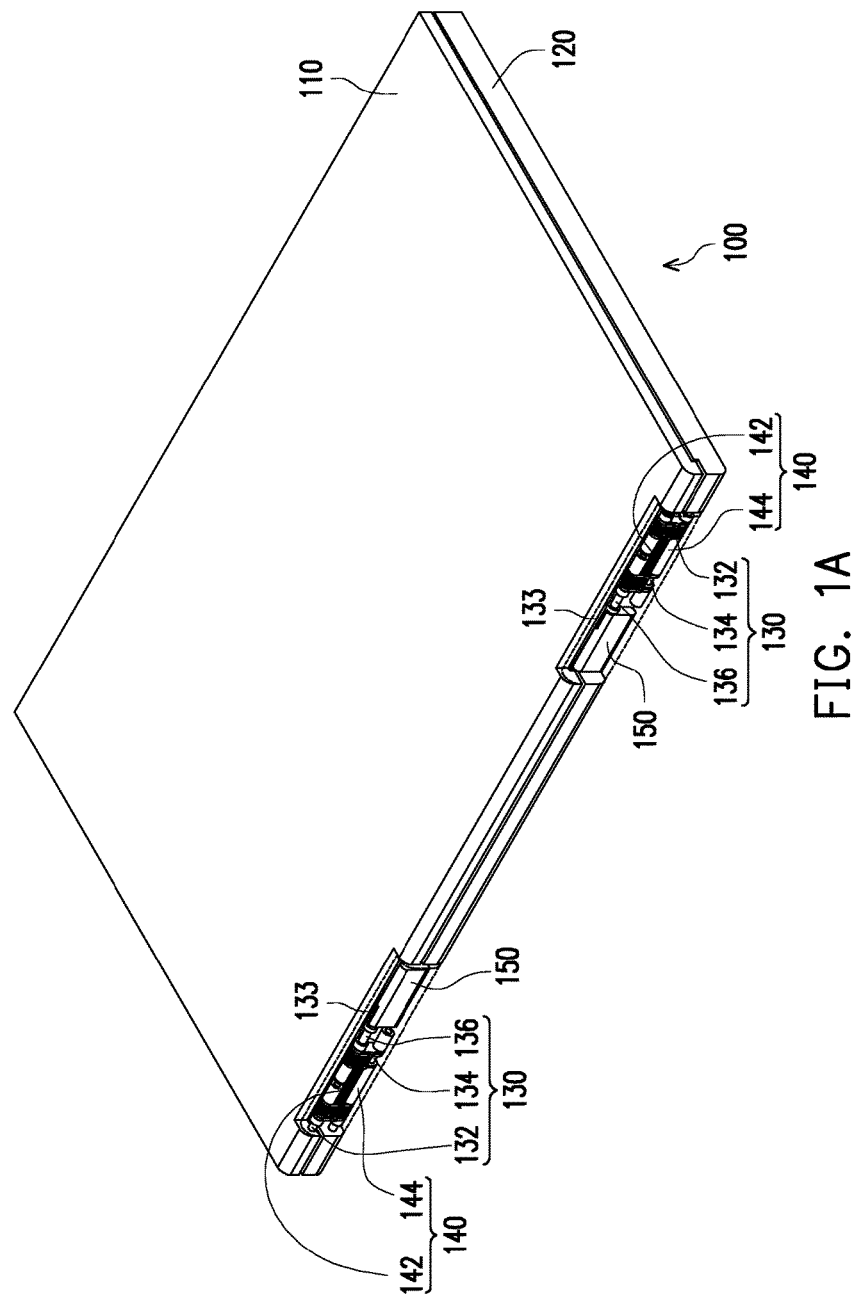
FIG. 1A is a schematic three-dimensional view illustrating a portable electronic device according to an embodiment of the application.
Figure 1B:
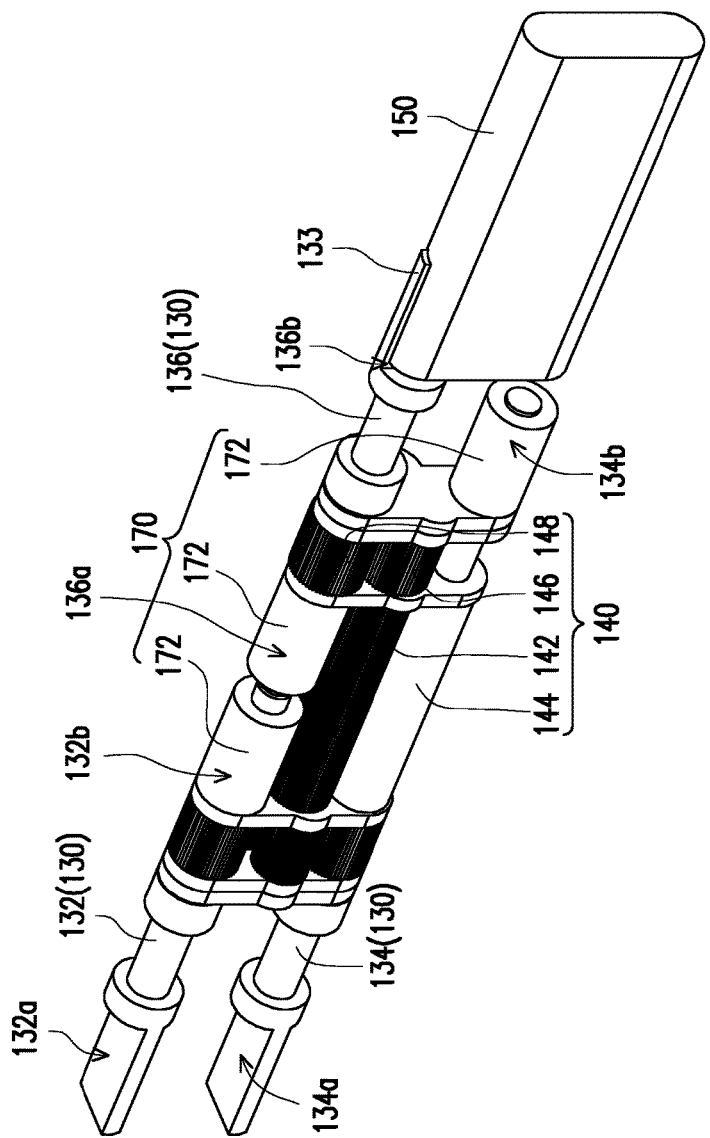
FIG. 1B is a schematic three-dimensional view illustrating a pivoting assembly of the portable electronic device of FIG. 1A.
Figure 1C:
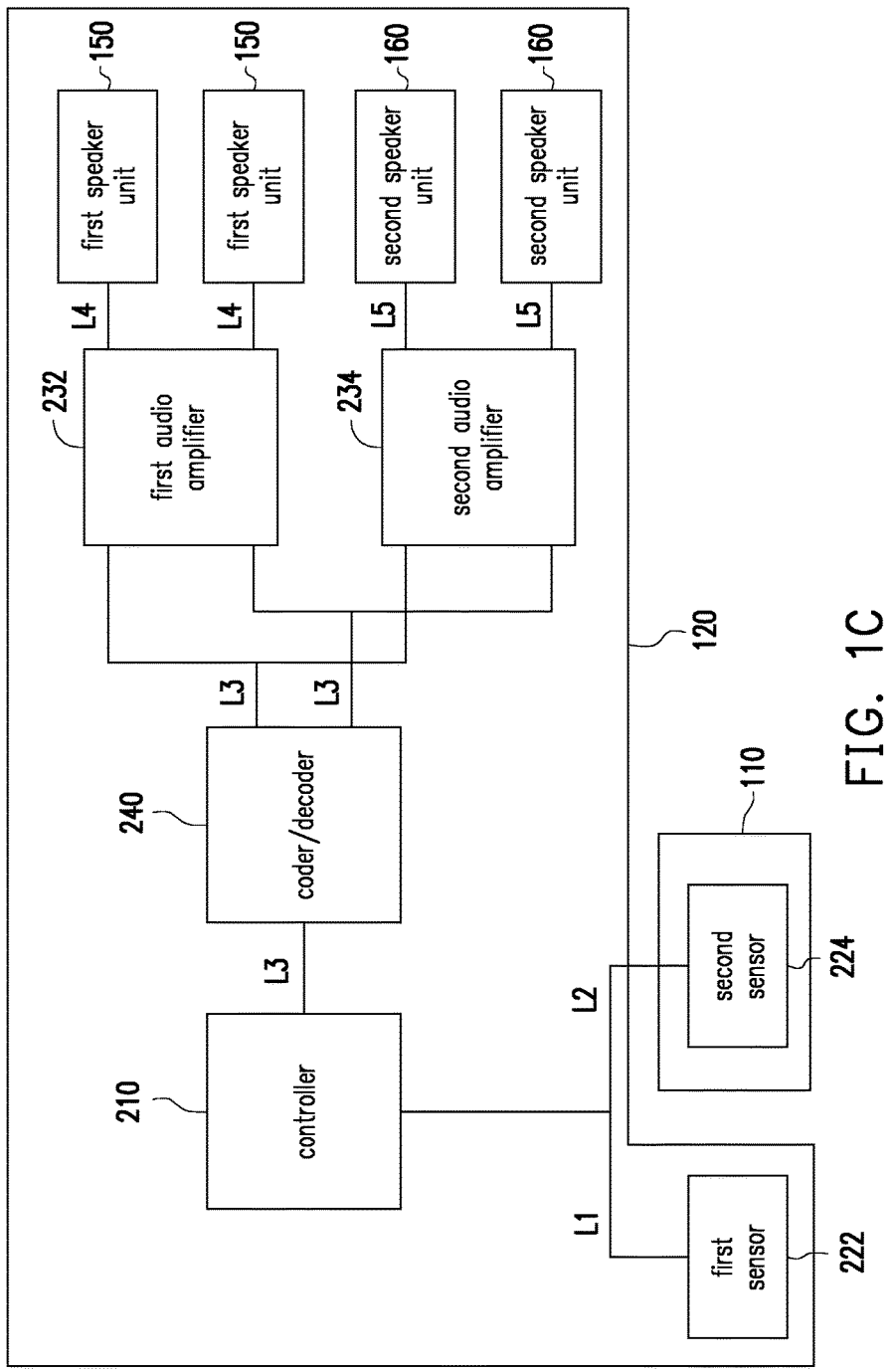
FIG. 1C is circuit block diagram illustrating a controller, a first sensor, a second sensor, a first audio amplifier, and a second audio amplifier of the portable electronic device of FIG. 1A.
Figure 2A:
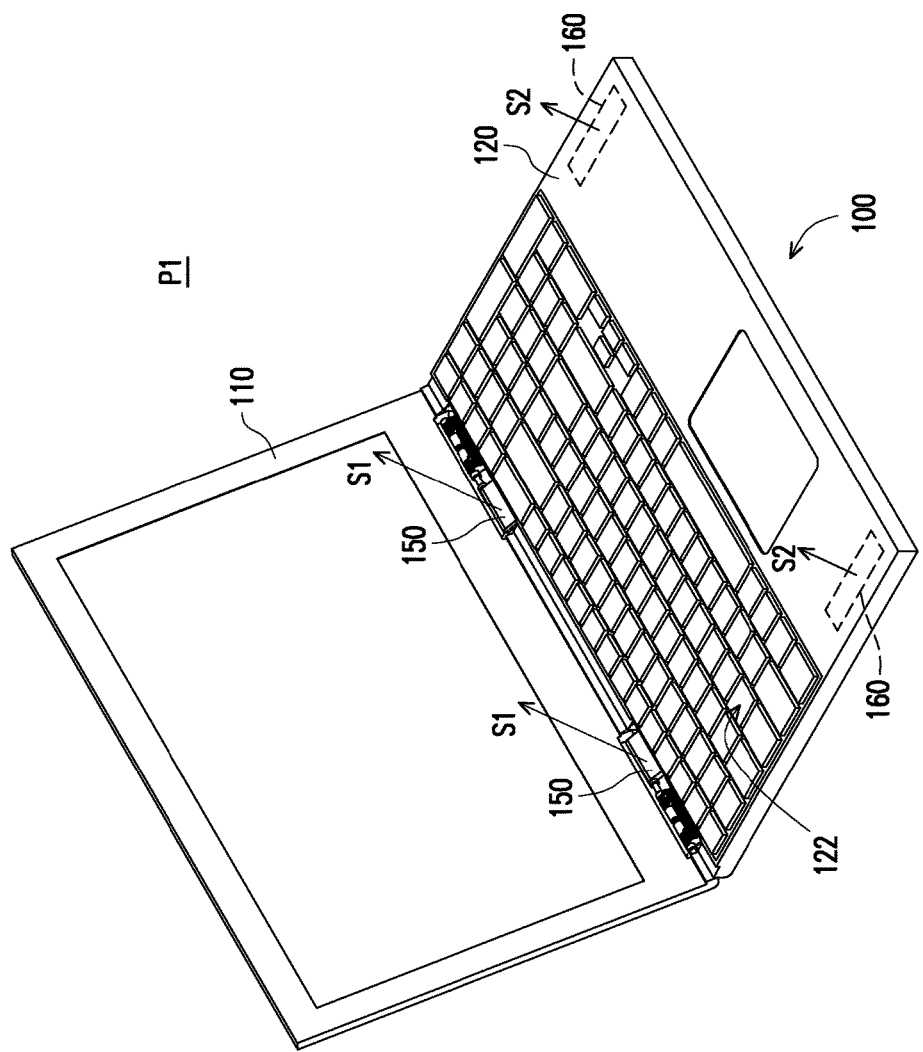
FIG. 2A is a schematic three-dimensional view illustrating the portable electronic device of FIG. 1A in an unfolded state.
Figure 2B:
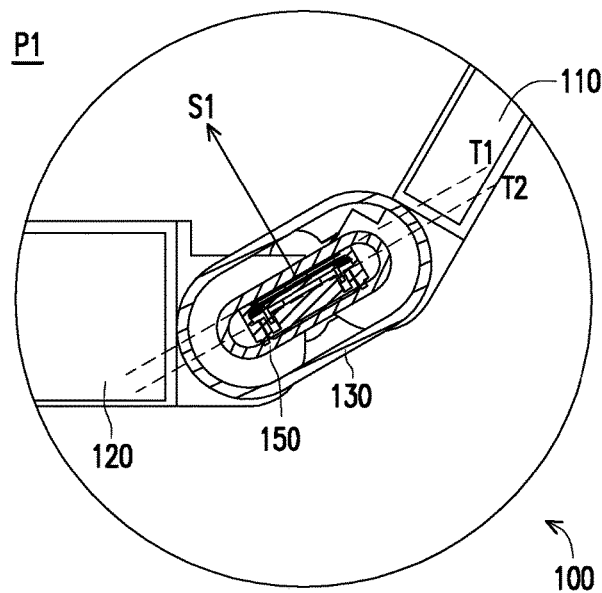
FIG. 2B and FIG. 2C are schematic local cross-sectional views illustrating the portable electronic device of FIG. 2A.
Figure 2C:
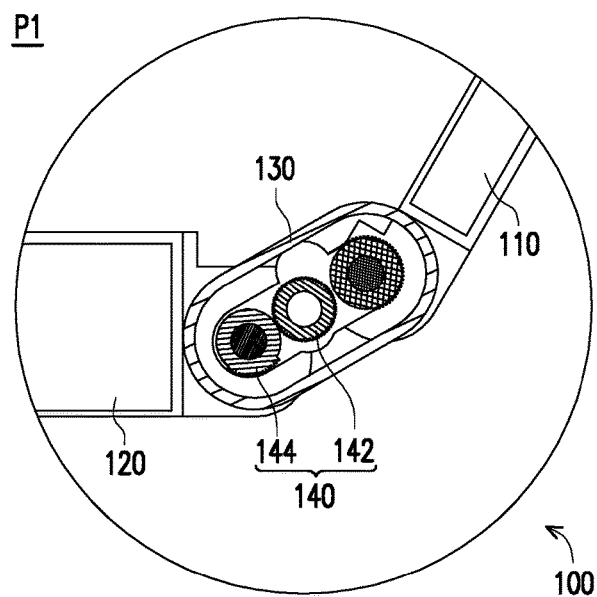
Figure 3A:
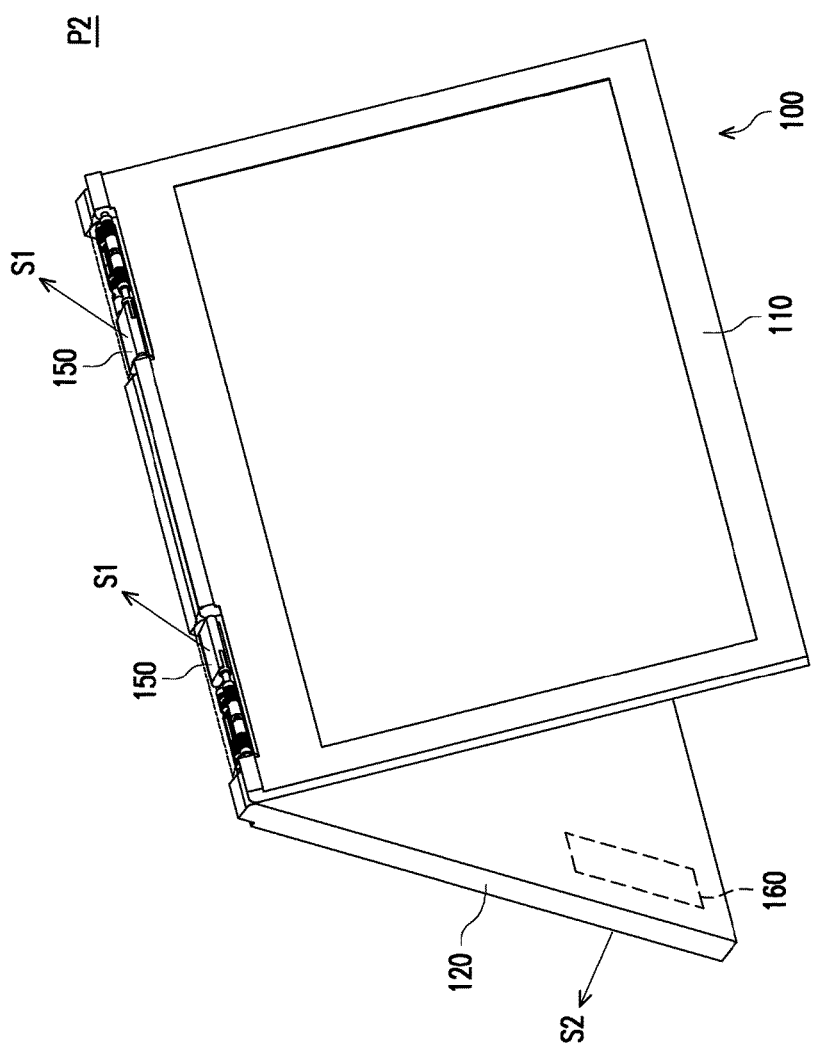
FIG. 3A is a schematic three-dimensional view illustrating the portable electronic device of FIG. 1A in another unfolded state.
Figure 3B:
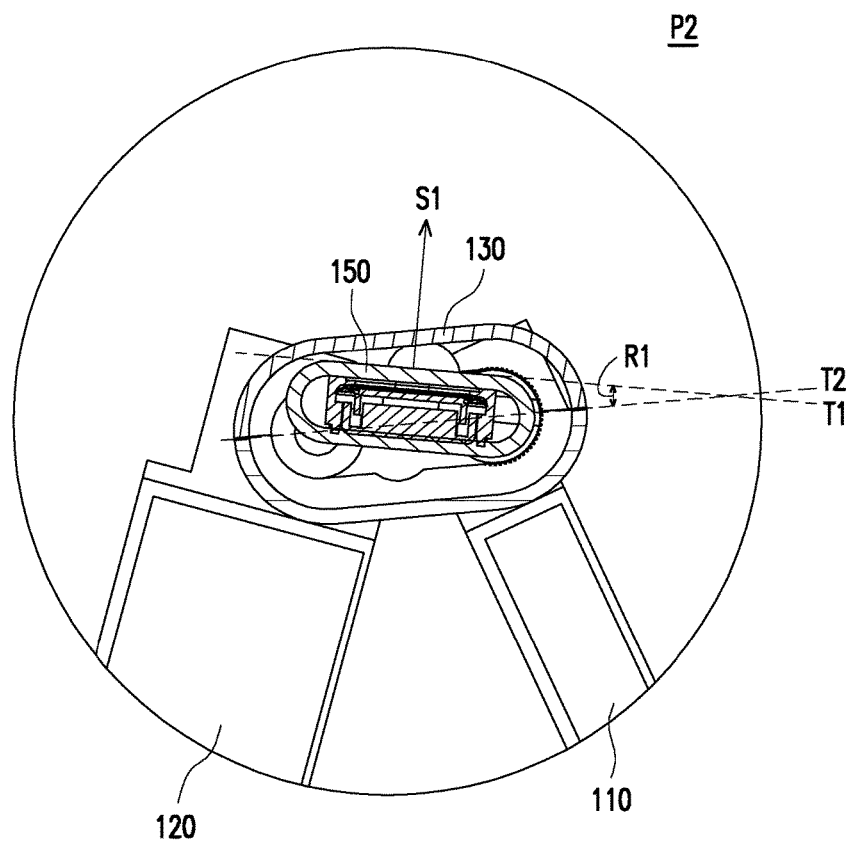
FIG. 3B and FIG. 3C are schematic local cross-sectional views illustrating the portable electronic device of FIG. 3A.
Figure 3C:
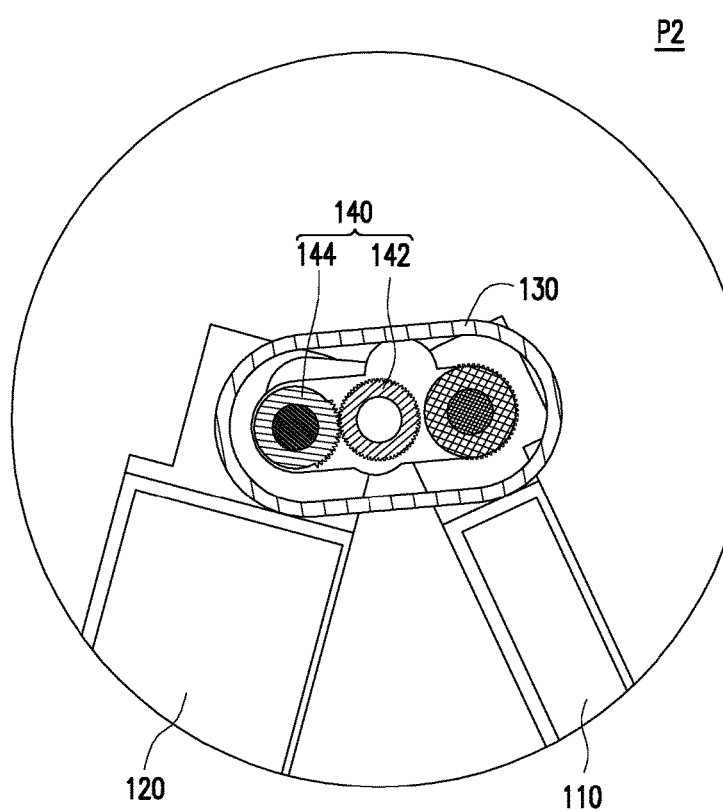
Figure 4A:
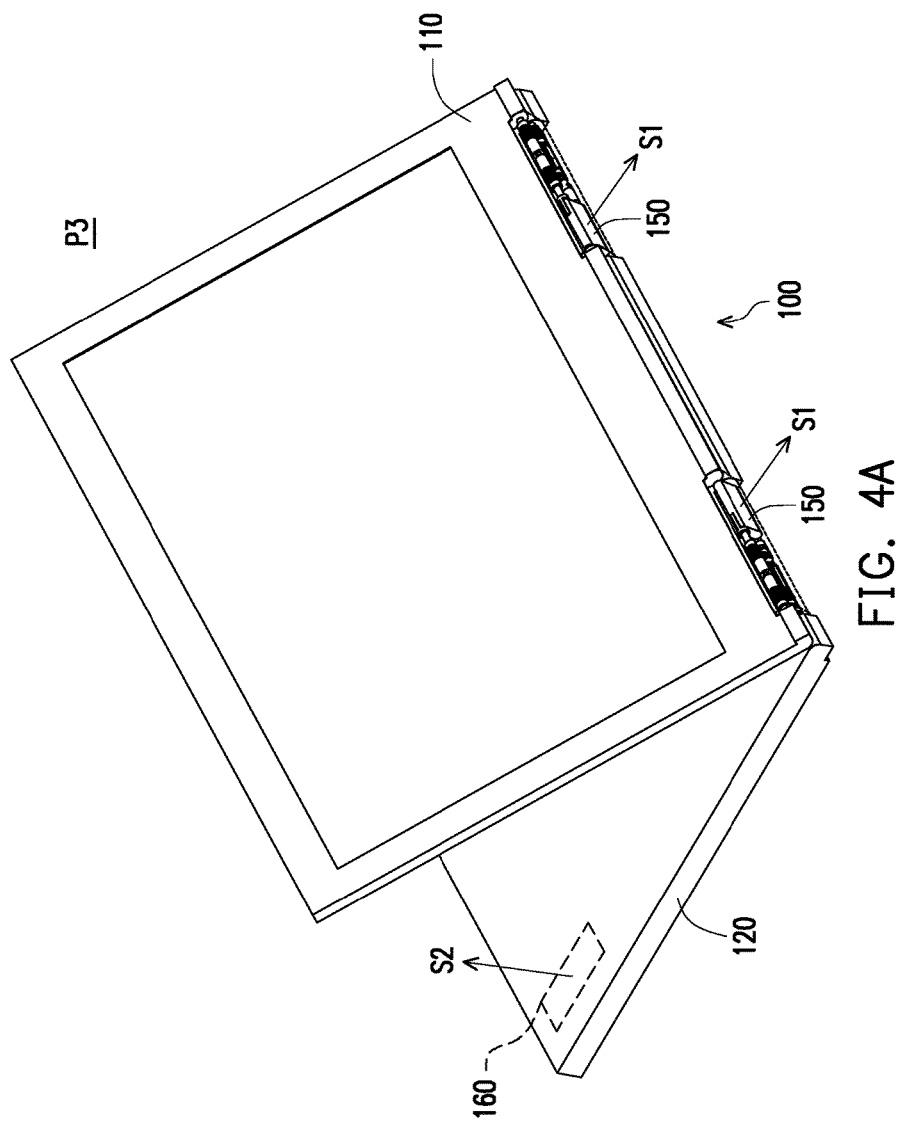
FIG. 4A is a schematic three-dimensional view illustrating the portable electronic device of FIG. 1A in another unfolded state.
Figure 4B:
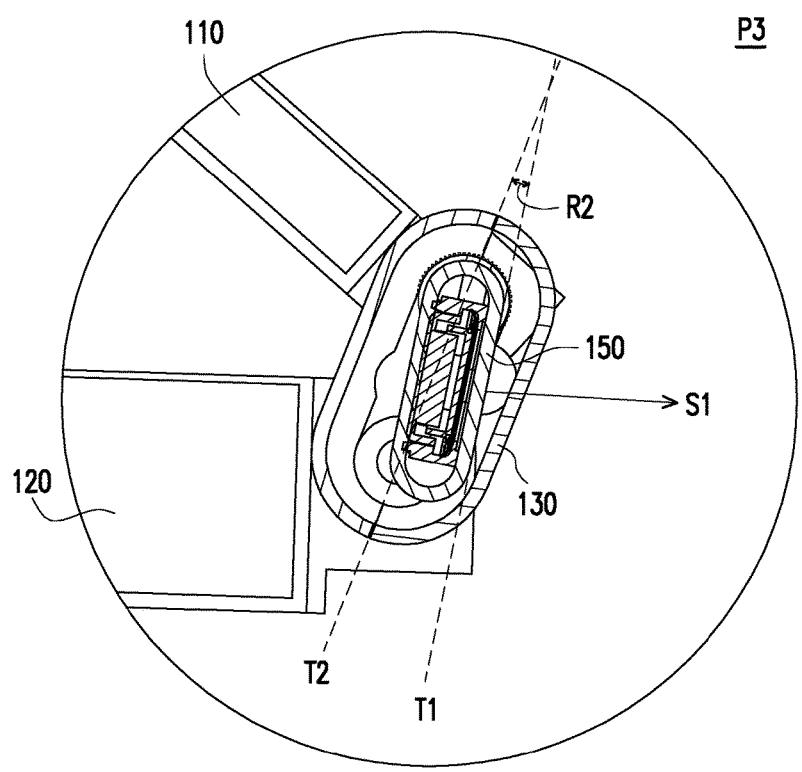
FIG. 4B and FIG. 4C are schematic local cross-sectional views illustrating the portable electronic device of FIG. 4A.
Figure 4C:
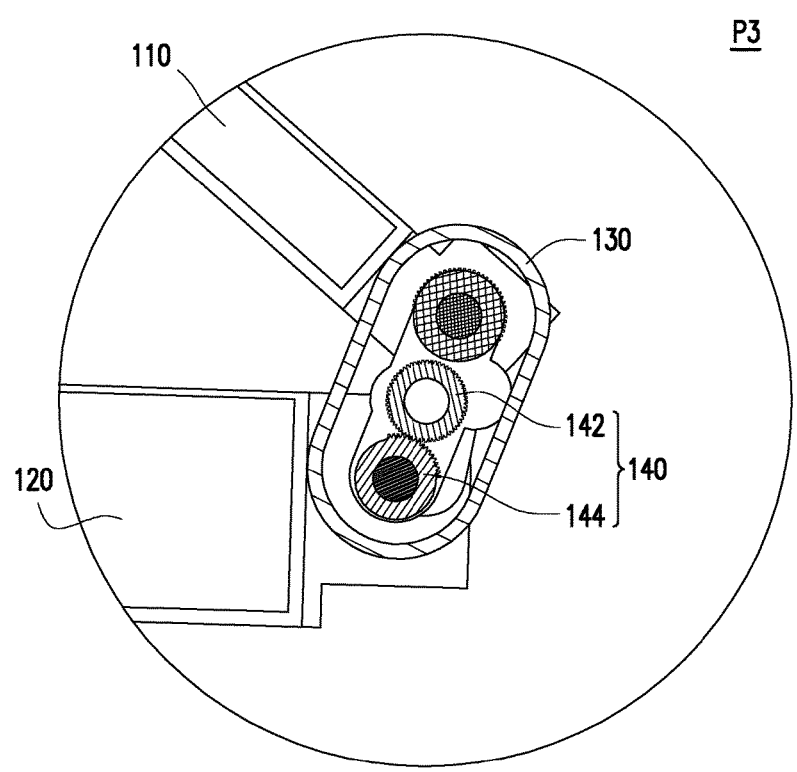
Figure 5A:
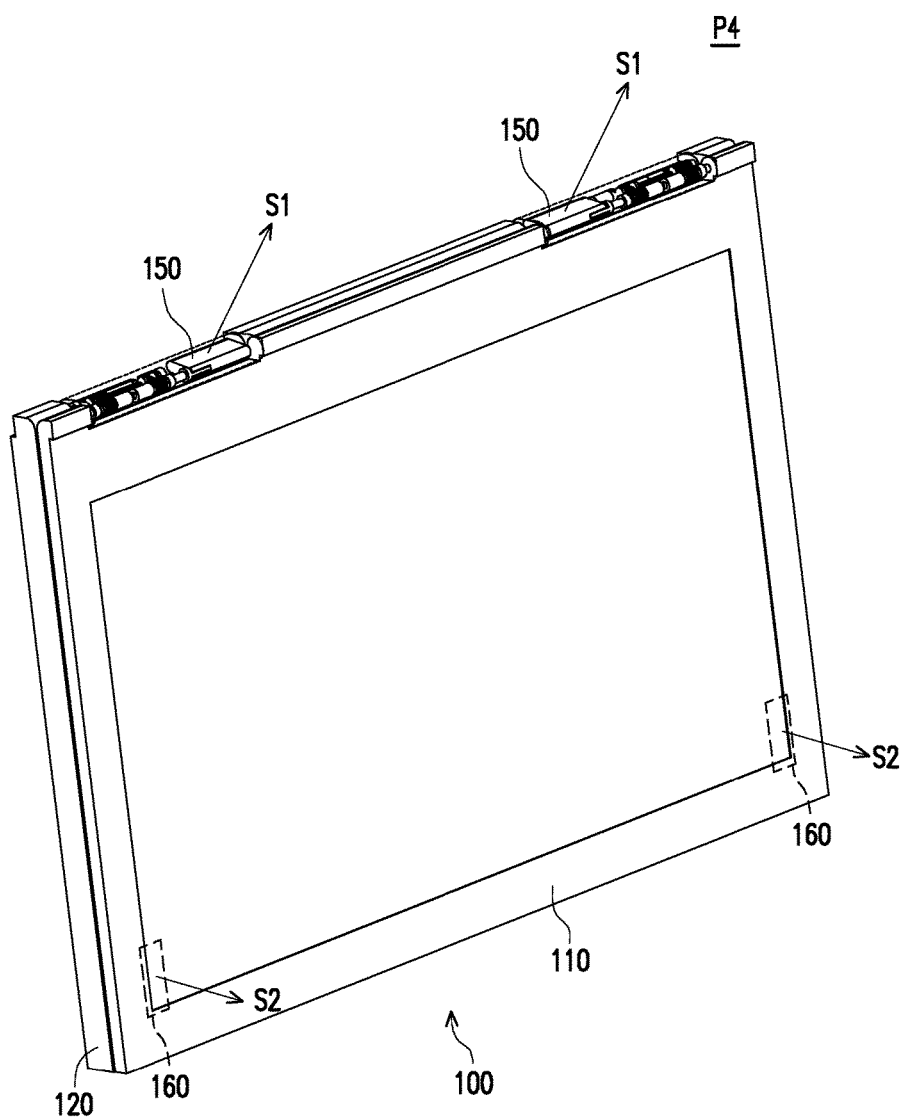
FIG. 5A is a schematic three-dimensional view illustrating the portable electronic device of FIG. 1A in an overlapping state.
Figure 5B:
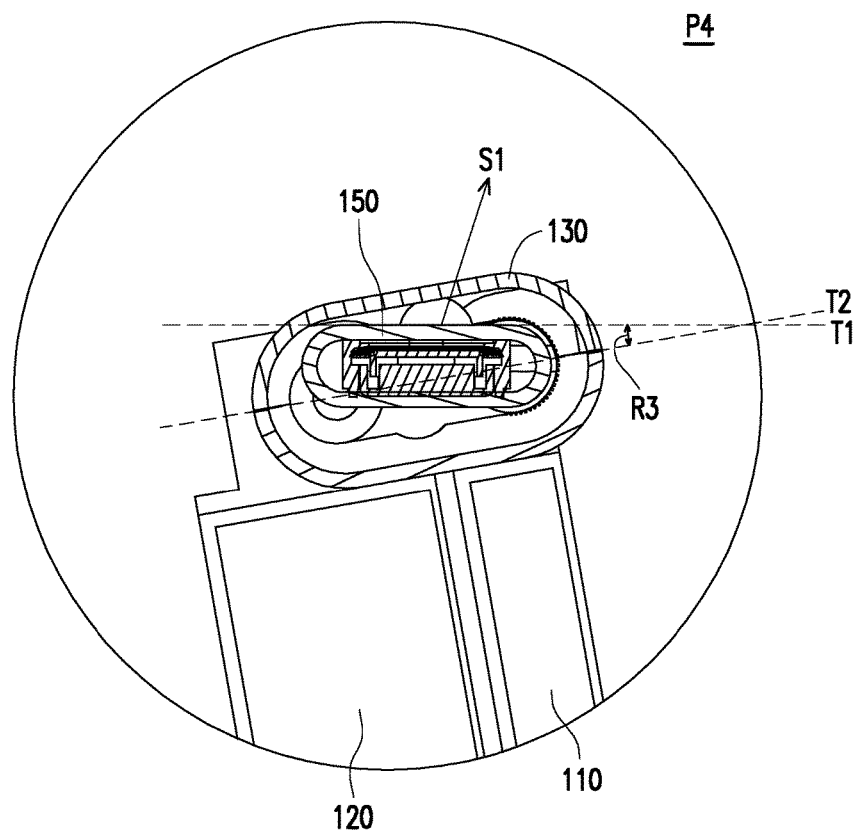
FIG. 5B and FIG. 5C are schematic local cross-sectional views illustrating the portable electronic device of FIG. 5A.
Figure 5C:
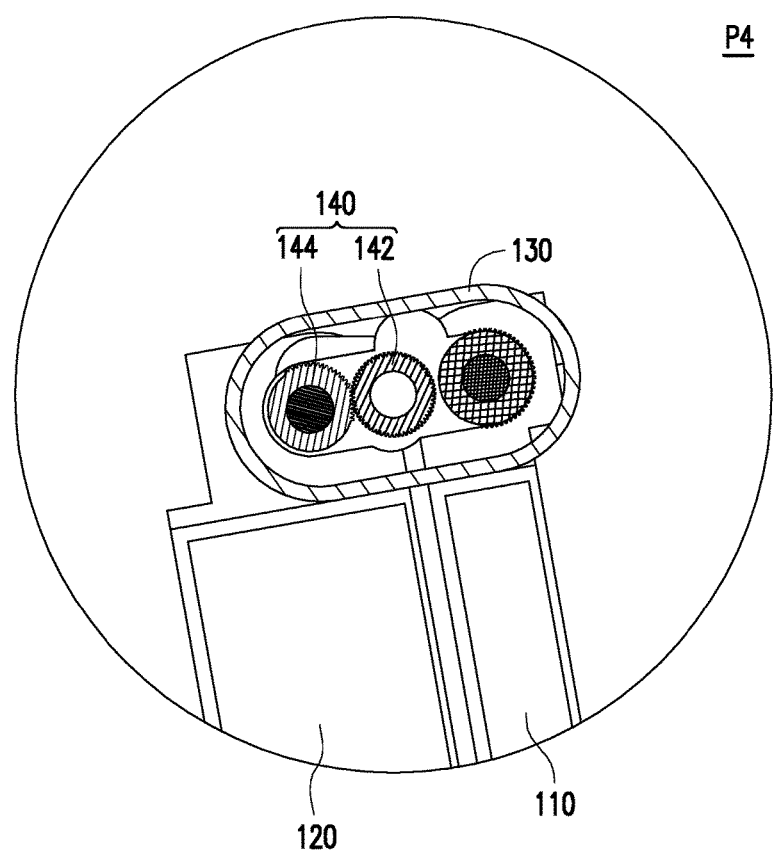

FIG. 1A is a schematic three-dimensional view illustrating a portable electronic device according to an embodiment of the application. FIG. 1B is a schematic three-dimensional view illustrating a pivoting assembly of the portable electronic device of FIG. 1A. FIG. 1C is circuit block diagram illustrating a controller, a first sensor, a second sensor, a first audio amplifier, and a second audio amplifier of the portable electronic device of FIG. 1A. FIG. 2A is a schematic three-dimensional view illustrating the portable electronic device of FIG. 1A in an unfolded state. FIG. 2B and FIG. 2C are schematic local cross-sectional views illustrating the portable electronic device of FIG. 2A. FIG. 3A is a schematic three-dimensional view illustrating the portable electronic device of FIG. 1A in another unfolded state. FIG. 3B and FIG. 3C are schematic local cross-sectional views illustrating the portable electronic device of FIG. 3A. FIG. 4A is a schematic three-dimensional view illustrating the portable electronic device of FIG. 1A in another unfolded state. FIG. 4B and FIG. 4C are schematic local cross-sectional views illustrating the portable electronic device of FIG. 4A. FIG. 5A is a schematic three-dimensional view illustrating the portable electronic device of FIG. 1A in an overlapping state. FIG. 5B and FIG. 5C are schematic local cross-sectional views illustrating the portable electronic device of FIG. 5A. To facilitate illustration, some components in FIG. 1A, FIG. 2A, FIG. 3A, FIG. 4A, and FIG. 5A are depicted in a transparent manner.

With reference to FIG. 1A and FIG. 1B together, a portable electronic device 100 includes a first body 110, a second body, 120, and two pivoting assemblies in this embodiment. Each of the pivoting assemblies includes a pivoting mechanism 130, a linking mechanism 140, a first speaker unit 150. The pivoting mechanism 130 is pivoted between the first body 110 and the second body 120 and includes a first rotating shaft 132, a second rotating shaft 134, and a third rotating shaft 136. Among them, the first rotating shaft 132 and the second rotating shaft 134 are parallel to each other, and the third rotating shaft 136 is located at a side of the first rotating shaft 132 and has a mounting portion 133. The linking mechanism 140 includes a first rolling member 142 and a second rolling member 144. The first rolling member 142 is connected to the third rotating shaft 136 of the pivoting mechanism 130, and the second rolling member 144 is connected to the second rotating shaft 134 of the pivoting mechanism 130. The first rolling member 142 and the second rolling member 144 roll relative to each other within an angle range (referring to FIG. 3C, FIG. 4C, and FIG. 5C). The first speaker unit 150 is fixed to the mounting portion 133 of the third rotating shaft 136 of the pivoting mechanism 130.

To be specific, in this embodiment, the first body 110 is, for example, a liquid crystal display screen, and the second body is, for example, a host. A user may open or close the portable electronic device 100 through relative movement between the first body 110 and the second body 120 driven by pivoting of the pivoting mechanism 130. Herein, the portable electronic device 100 is, for example, a notebook computer, but is not limited thereto.

With reference to FIG. 1B again, the first rotating shaft 132 of the pivoting mechanism 130 of this embodiment has a first end 132a and a second end 132b opposite to each other, wherein the first end 132a is pivoted to the first body 110. The second rotating shaft 134 of the pivoting mechanism 130 has a third end 134a and a fourth end 134b opposite to each other, wherein the third end 134a is adjacent to the first end 132a and is pivoted to the second body 120. The third rotating shaft 136 of the pivoting mechanism 130 has a fifth end 136a and a sixth end 136b opposite to each other, wherein the sixth end 136b has the mounting portion 133. Moreover, the portable electronic device 100 of this embodiment further includes a torque mechanism 170, wherein the torque mechanism 170 has a plurality of torque portions 172. The torque portions 172 are sleeved on the second end 132b of the first rotating shaft 132, the fourth end 134b of the second rotating shaft 134, and the fifth end 136a of the third rotating shaft 136, so as to provide torsion force required when pivoting.

As shown in FIG. 1B, FIG. 3C, FIG. 4C, and FIG. 5C, the first rolling member 142 and the second rolling member 144 of the linking mechanism 140 may roll relatively within an angle range. Among them, one of the first rolling member 142 and the second rolling member 144 is a gear, and the other one of the first rolling member 142 and the second rolling member 144 is a cam. Herein, the first rolling member 142 is embodied as a gear, and the second rolling member 144 is embodied as a cam. Among them, a number of teeth of the first rolling member 142 is greater than a number of teeth of the second rolling member 144, and only a specific portion of the second rolling member 144 has teeth. Hence, the first rolling member 142 and the second rolling member 144 roll relative to each other only within a specific angle range. In other words, even though the second rolling member 144 drives the first rolling member 142 and the first rolling member 142 and the second rolling member 144 mesh with each other, the second rolling member 144 can not drive the first rolling member 142 with another portion except the specific portion so that idle movement is generated between the first rolling member 142 and the second rolling member 144. Further, the linking mechanism 140 further includes a third rolling member 146 and a fourth rolling member 148, wherein the third rolling member 146 is connected to the first rolling member 142, and the fourth rolling member 148 is connected to the third rotating shaft 136 and rolls relative to the third rolling member 146. Through the foregoing design, the first rolling member 142 may be driven or not be driven to enable the third rotating shaft 136 to rotate or not to rotate, and that the first speaker unit 150 is or is not linked up. In this way, a plane T1 of the first speaker unit 150 on the third rotating shaft 136 is parallel to a geometric plane T2 defined by the first rotating shaft 132 and the second rotating shaft 134 (referring to FIG. 2B), or an included angle R1 (referring to FIG. 3B), an included angle R2 (referring to FIG. 4B), and an included angle R3 (referring to FIG. 5B) are provided between the plane T1 and the geometric plane T2. An audio output direction S1 of the first speaker unit 150 may thereby face the user (referring to FIG. 2A, FIG. 2B, FIG. 3A, FIG. 3B, FIG. 4A, and FIG. 4B). In other words, the first speaker unit 150 of this embodiment is a speaker unit capable of adjusting the audio output direction. Herein, the first speaker unit 150 is embodied as a tweeter.

With reference to FIG. 2A, the portable electronic device 100 of this embodiment further includes at least one second speaker unit 160 built in the second body 120, wherein an audio output direction S2 of the second speaker unit 160 faces an upper surface 122 of the second body 120, but is not limited thereto. That is, the second speaker unit 160 is a speaker unit having fixed audio output direction and is incapable of adjusting the audio output direction. Herein, the second speaker unit 160 may be a tweeter or a woofer. In the following, the second speaker unit 160 is exemplified by being a woofer, but is not limited thereto. Certainly, in other embodiments (not shown), the audio output direction of the second speaker unit can also be toward a surface of a table, or toward a side, or toward a surface of a table and at an angle that is biased to the left and right.

With reference to FIG. 1C, the portable electronic device 100 of this embodiment may further include a controller 210, a first sensor 222, a second sensor 224, a first audio amplifier 232, and a second audio amplifier 234. The controller 210 is disposed in the second body 120, wherein the controller 210 is, for example, a system on chip (SoC) for determining whether a system is in a notebook mode (referring to FIG. 2A), a tent mode (referring to 3A), a video mode (referring to FIG. 4A), or a tablet mode (referring to FIG. 5A). The first sensor 222 is disposed in the first body 110 for sensing an angle and a mode of relative movement between the first body 110 and the second body 120, so as to generate a first sensing signal L1. The second sensor 224 is disposed in the second body 120 for sensing the angle and the mode of the relative movement between the first body 110 and the second body 120, so as to generate a second sensing signal L2. Herein, both the first sensor 222 and the second sensor 224 are gravity sensors (G sensors), but are not limited thereto.

Further, the first audio amplifier 232 is disposed next to the first speaker unit 150, and the second audio amplifier 234 is disposed next to the second speaker unit 160, but is not limited thereto. Herein, the first audio amplifier 232 and the second audio amplifier 234 can output a digital audio frequency signal L3 to the first speaker unit 150 and the second speaker unit 160 through an internal digital analog converter (DAC) and perform optimization according to maximum output power of the first speaker unit 150 and the second speaker unit 160. When the controller 210 receives the first sensing signal L1 from the first sensor 222 and the second sensing signal L2 from the second sensor 224 through a transmission interface (e.g., an inter-Integrated bus (I2C)), the controller 210 outputs the audio frequency signal L3 to a coder/decoder 240 (e.g., Codec) according to first sensing signal L1 and the second sensing signal L2 through a transmission interface (e.g., HDA) providing high audio quality and multi-channel transmission. The audio frequency signal L3 can be coded and decoded through the coder/decoder 240. Next, the coded/decoded audio frequency signal L3 is transmitted to the first audio amplifier 232 and the second audio amplifier 234 through the transmission interface (e.g., I2C or I2S). The first audio amplifier 232 receives the audio frequency signal L3 and outputs a first driving signal L4 to the first speaker unit 150, so as to adjust volume and an audio frequency of the first speaker unit 150. The second audio amplifier 234 receives the audio frequency signal L3 and outputs a second driving signal L5 to the second speaker unit 160, so as to adjust volume and an audio frequency of the second speaker unit 160. The circuit block diagram is only for illustration. Certainly, in other embodiments (not shown), the first audio amplifier and the second audio amplifier do not have to be disposed next to the first speaker unit and second speaker unit, respectively.

In short, in the portable electronic device 100 of this embodiment, the angle and mode of the relative movement between the first body 110 and the second body 120 may be sensed through the first sensor 222 and the second sensor 224. In this way, the volume and audio frequencies of the first speaker unit 150 and the second speaker unit 160 can be adjusted, and that the user may enjoy a more favorable audio experience when using the portable electronic device 100. In addition, a user interface may also be added in this embodiment to adjust the volume and audio frequencies of the first speaker unit 150 and the second speaker unit 160 through automatic adjustment or manual adjustment set by the system. Hence, the portable electronic device 100 may deliver more favorable sound effect.

The following provides detailed description of relative positions and the audio output directions of the first speaker unit 150 and the second speaker unit 160 when the portable electronic device 100 is presented in the notebook mode (referring to FIG. 2A), the tent mode (referring to FIG. 3A), the video mode (referring to FIG. 4A), or the tablet mode (referring to FIG. 5A) resulted from the relative movement between the first body 110 and the second body 120. The following also provides detailed description of volume and audio frequency adjustment of the first speaker unit 150 and the second speaker unit 160.

With reference to FIG. 2A, FIG. 2B, and FIG. 2C together, when the first body 110 and the second body 120 moves relatively and an unfolded state P1 is thus presented, the second rolling member 144 and the first rolling member 142 of the linking mechanism 140 are not within the angle range. That is, the idle movement is generated between the first rolling member 142 and the second rolling member 144, and that the first rolling member 142 is not driven to drive the third rotating shaft 136 to rotate. As such, the plane T1 of the first speaker unit 150 is parallel to the geometric plane T2, and the audio output direction S1 of the first speaker unit 150 thereby faces the user. At this time, an angle of the unfolded state P1 is greater than 0 degree and is less than or equal to 180 degrees, that is, the notebook mode.

When the notebook mode is sensed by the first sensor 222 (referring to FIG. 1C) and the second sensor 224 (referring to FIG. 1C) of the portable electronic device 100, the user may choose to manually adjust or allow the system to automatically adjust maximum bandwidths of the first speaker unit 150 and the second speaker unit 160 for listening. For instance, automatic adjustment made by the system is adopted, an equalizer may be used to set crossover points suitable for the notebook mode for the first speaker unit 150 and the second speaker unit 160, so as to adjust the first speaker unit 150 and the second speaker unit 160 to cover the maximum bandwidths. Since the treble first speaker unit 150 faces the user, a treble range may be best extended, and favorable acoustic effect is provided by the portable electronic device 100.

With reference to FIG. 3A, FIG. 3B, and FIG. 3C together, when the first body 110 and the second body 120 moves relatively and an unfolded state P2 is thus presented, the second rolling member 144 drives the first rolling member 142 of the linking mechanism 140. That is, the first rolling member 142 and the second rolling member 144 mesh with each other, so as to link up the first speaker unit 150. In this way, the included angle R1 is provided between the plane T1 of the first speaker unit 150 and the geometric plane T2, and that the audio output direction S1 of the first speaker unit 150 faces the user. At this time, an angle of the unfolded state P2 is, for example, greater than 180 degrees and less than 270 degrees, that is, the tent mode. Moreover, the included angle R1 is, for example, between 8 degrees and 10 degrees.

In the tent mode, front edges of the first body 110 and the second body 120 are in downward contact with a plane (e.g., a surface of a table). At this time, the audio output direction S1 of the first speaker unit 150 faces the user, the second speaker unit 160 is behind the first body 110, and sound provided by the second speaker unit 160 is backward outputted, that is, the audio output direction S2 is away from the user. Certainly, in other embodiments (not shown), the audio output direction of the second speaker unit can also be toward the surface of the table, or toward a side, or toward the surface of the table and at an angle that is biased to the left and right. When the tent mode is sensed by the first sensor 222 (referring to FIG. 1C) and the second sensor 224 (referring to FIG. 1C) of the portable electronic device 100, the user may choose to manually adjust or allow the system to automatically adjust the balanced volume and audio frequencies of the first speaker unit 150 and the second speaker unit 160 for listening. For instance, if the automatic adjustment made by the system is adopted, the equalizer may be used to set the crossover points suitable for the tent mode for the first speaker unit 150 and the second speaker unit 160. Since the audio output direction S2 of the bass second speaker unit 160 is away from the user, when the outputted volume and bandwidth of the bass second speaker unit 160 are appropriately lowered so as to be matched with the treble first speaker unit 150, the balanced sound effect may be achieved.

With reference to FIG. 4A, FIG. 4B, and FIG. 4C together, when the first body 110 and the second body 120 moves relatively and an unfolded state P3 is thus presented, the second rolling member 144 drives the first rolling member 142 of the linking mechanism 140. That is, the first rolling member 142 and the second rolling member 144 mesh with each other, so as to link up the first speaker unit 150. In this way, the included angle R2 is provided between the plane T1 of the first speaker unit 150 and the geometric plane T2, and that the audio output direction S1 of the first speaker unit 150 faces the user. Herein, an angle of the unfolded state P3 is, for example, greater than 270 degrees and is less than 360 degrees, that is, the video mode. Moreover, the included angle R2 is, for example, between 8 degrees and 10 degrees.

In the video mode, the upper surface 122 of the second body 120 is in downward contact with a plane (e.g., a surface of a table). At this time, the audio output direction S1 of the first speaker unit 150 faces the user, the second speaker unit 160 is behind the first body 110, and the audio output direction S2 of the second speaker unit 160 does not face the user. When the video mode is sensed by the first sensor 222 (referring to FIG. 1C) and the second sensor 224 (referring to FIG. 1C) of the portable electronic device 100, the user may choose to manually increase or allow the system to automatically increase the volume and audio frequencies of the first speaker unit 150 and the second speaker unit 160 for enhancing the sound effect. For instance, if the automatic adjustment made by the system is adopted, the equalizer may be used to set the crossover points suitable for the video mode for the first speaker unit 150 and the second speaker unit 160. Since the audio output direction S2 of the bass second speaker unit 160 faces upward, does not face the user, and is not blocked by any object, when the outputted volume and bandwidth of the bass second speaker unit 160 is adjusted to a greater level, the portable electronic device 100 may provide enhanced bass sound effect.

With reference to FIG. 5A, FIG. 5B, and FIG. 5C together, when the first body 110 and the second body 120 moves relatively and an overlapping state P4 is thus presented, the second rolling member 144 drives the first rolling member 142 of the linking mechanism 140. That is, the first rolling member 142 and the second rolling member 144 mesh with each other, so as to link up the first speaker unit 150. In this way, the included angle R3 is provided between the plane T1 of the first speaker unit 150 and the geometric plane T2, and that the audio output direction S1 of the first speaker unit 150 faces the user. Herein, the overlapping state P4 is generated by flipping the first body 110 and the second body 120 relatively by 360 degrees, that is, the tablet mode. At this time, the audio output direction S1 of the first speaker unit 150 faces the user, and the second speaker unit 160 is behind the first body 110 and is blocked by the first body 110 to a great extent.

In the tablet mode, when the video mode is sensed by the first sensor 222 (referring to FIG. 1C) and the second sensor 224 (referring to FIG. 1C) of the portable electronic device 100, the user may choose to manually increase or allow the system to automatically increase the volume and audio frequency of the first speaker unit 150 to obtain the balanced volume and audio frequency of the second speaker unit 160 for obtaining clearer sound effect. For instance, if the automatic adjustment made by the system is adopted, the equalizer may be used to set the crossover points suitable for the tablet mode for the first speaker unit 150 and the second speaker unit 160. As the audio output direction S2 of the bass second speaker unit 160 is blocked by the first body 110, vibration may be prevented by lowering the outputted volume and bandwidth of the second speaker unit 160 to a greater extent. At the same time, if a surface of the treble first speaker unit 150 is improved, enhanced clarity can be provided.

To be more specific, in the notebook mode, the first speaker unit 150 located on the mounting portion 133 of the pivoting mechanism 130 is not required to roll. Hence, the idle movement is required between the first rolling member 142 and the second rolling member 144. In this way, the user may fix a position of the first speaker unit 150 in the notebook mode, that is, the plane T1 of the first speaker unit 150 is parallel to the geometric plane T2 defined by the first rotating shaft 132 and the second rotating shaft 134. Afterwards, not until the first rolling member 142 and the second rolling member 144 begin to mesh with each other in other modes does the first speaker unit 150 begins to rotate to adjust the angles. In other words, the second rotating shaft 134 of the pivoting mechanism 130 drives the second rolling member 142 to roll and thus drives the first rolling member 142 to roll within the angle range. As such, the third rotating shaft 136 rotates, and that the included angles R1, R2, and R3 are provided between the plane T1 of the first speaker unit 150 and the geometric plane T2 defined by the first rotating shaft 132 and the second rotating shaft 134.

In short, with reference to FIG. 1C again, when different modes, such as the notebook mode, the tent mode, the video mode, and the tablet mode, are sensed by the first sensor 222 and the second sensor 224 of the portable electronic device 100, a signal may be amplified by transmitting the audio frequency signal L3 to the first audio amplifier 232 and the second audio amplifier 234 through the controller 210 and the coder/decoder 240. At this time, a user window is popped up showing interface icons for the user to choose to manually adjust or allow the system to automatically adjust the volume and audio frequencies of the first speaker unit 150 and the second speaker unit 160. If manual adjustment is selected, the bass may be boosted, a medium frequency may be further clarified, and the treble range may be specifically extended. If the automatic adjustment made by the system is adopted, the equalizer may be used to set the crossover points suitable for different modes for the first speaker unit 150 and the second speaker unit 160.

In view of the foregoing, in the portable electronic device provided by the embodiments of the application, the audio output direction of the speaker unit fixed on the pivoting mechanism can be changed to face the user according to the relative movement between the first body and the second body. In this way, the user may enjoy the best sound effect when using the portable electronic device provided by the embodiments of the application. Further, in the portable electronic device provided by the embodiments of the application, the angle and mode of the relative movement between the first body and the second body may be sensed through the sensors, so as to accordingly adjust the volume and audio frequencies of the speaker units. As such, the user may have favorable listening experience when using the portable electronic device provided by the embodiments of the application. In addition, a user interface may also be added in the embodiments of the application to adjust the volume and audio frequencies of the speaker units through automatic adjustment or manual adjustment set by the system.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A portable electronic device, comprising:
a first body;
a second body;
a pivoting mechanism, pivoted between the first body and the second body and comprising a first rotating shaft, a second rotating shaft, and a third rotating shaft, wherein the first rotating shaft and the second rotating shaft are parallel to each other, and the third rotating shaft is located at a side of the first rotating shaft and has a mounting portion;

a linking mechanism, comprising a first rolling member and a second rolling member, wherein the first rolling member is connected to the third rotating shaft of the pivoting mechanism, the second rolling member is connected to the second rotating shaft of the pivoting mechanism, and the first rolling member and the second rolling member roll relative to each other within an angle range; and a first speaker unit, fixed to the mounting portion, wherein the second rotating shaft of the pivoting mechanism drives the second rolling member to roll and drives the first rolling member to roll within the angle range to enable the third rotating shaft to rotate when the first body and the second body moves relative to each other and that an included angle is provided between a plane of the first speaker unit and a geometric plane defined by the first rotating shaft and the second rotating shaft.

2. The portable electronic device as claimed in claim 1, further comprising:

a torque mechanism, having a plurality of torque portions, wherein the first rotating shaft has a first end and a second end opposite to each other, the first end is pivoted to the first body, the second rotating shaft has a third end and a fourth end opposite to each other, the third end is adjacent to the first end and is pivoted to the second body, the third rotating shaft has a fifth end and a sixth end opposite to each other, the sixth end has the mounting portion, and the torque portions are sleeved on the second end, the fourth end, and the fifth end.

3. The portable electronic device as claimed in claim 1, wherein one of the first rolling member and the second rolling member is a gear, and the other one of the first rolling member and the second rolling member is a cam.

4. The portable electronic device as claimed in claim 1, further comprising:

at least one second speaker unit, built in the second body, and an audio output direction of the at least one second speaker unit facing an upper surface of the second body.

5. The portable electronic device as claimed in claim 4, further comprising:

a controller, disposed in the second body;

a first sensor, disposed in the first body for sensing an angle and a mode of relative movement between the first body and the second body so as to generate a first sensing signal;

a second sensor, disposed in the second body for sensing the angle and the mode of the relative movement between the first body and the second body so as to generate a second sensing signal;

a first audio amplifier, disposed next to the first speaker unit; and a second audio amplifier, disposed next to the at least one second speaker unit, wherein the controller receives the first sensing signal from the first sensor and the second sensing signal from the second sensor and outputs an audio frequency signal to the first audio amplifier and the second audio amplifier according to the first sensing signal and the second sensing signal, the first audio amplifier receives the audio frequency signal and outputs a first driving signal to the first speaker unit so as to adjust volume and an audio frequency of the first speaker unit, and the second audio amplifier receives the audio frequency signal and outputs a second driving signal to the at least one second speaker unit so as to adjust volume and an audio frequency of the second speaker unit.

6. The portable electronic device as claimed in claim 1, wherein the second rolling member and the first rolling member are not within the angle range when the first body and the second body move relative to each other to present an unfolded state so that the first rolling member is not driven to drive the third rotating shaft to rotate such that the plane of the first speaker unit and the geometric plane are parallel to each other.

7. The portable electronic device as claimed in claim 6, wherein an angle of the unfolded state is greater than 0 degree and is less than or equal to 180 degrees.

8. The portable electronic device as claimed in claim 1, wherein the second rolling member drives the first rolling member when the first body and the second body move relative to each other to present an unfolded state so that the first speaker unit is linked up and that the included angle is provided between the plane of the first speaker unit and the geometric plane.

9. The portable electronic device as claimed in claim 8, wherein an angle of the unfolded state is greater than 180 degrees and is less than 360 degrees, and the included angle is between 8 degrees and 10 degrees.

10. The portable electronic device as claimed in claim 1, wherein the second rolling member drives the first rolling member when the first body and the second body move relative to each other to present an overlapping state so that the first speaker unit is linked up and that the included angle is provided between the plane of the first speaker unit and the geometric plane.

11. The portable electronic device as claimed in claim 1, wherein the linking mechanism further comprises a third rolling member and a fourth rolling member, the third rolling member is connected to the first rolling member, and the fourth rolling member is connected to the third rotating shaft and rolls relative to the third rolling member.

12. A pivoting assembly, comprising:

a pivoting mechanism, comprising a first rotating shaft, a second rotating shaft, and a third rotating shaft, wherein the first rotating shaft and the second rotating shaft are parallel to each other, and the third rotating shaft is located at a side of the first rotating shaft and has a mounting portion;

a linking mechanism, comprising a first rolling member and a second rolling member, wherein the first rolling member is connected to the third rotating shaft of the pivoting mechanism, the second rolling member is connected to the second rotating shaft of the pivoting mechanism, and the first rolling member and the second rolling member roll relative to each other within an angle range; and a speaker unit, fixed to the mounting portion, wherein an included angle is provided between a plane of the speaker unit and a geometric plane defined by the first rotating shaft and the second rotating shaft when the second rotating shaft of the pivoting mechanism drives the second rolling member to roll and drives the first rolling member to roll within the angle range to enable the third rotating shaft to rotate.

* * * * *